(12) United States Patent
Lee et al.

(10) Patent No.: US 6,773,961 B1
(45) Date of Patent: Aug. 10, 2004

(54) SINGULATION METHOD USED IN LEADLESS PACKAGING PROCESS

(75) Inventors: Jun Hong Lee, Paju-Si (KR); Hyung Jun Park, Paju-Si (KR); Hyeong No Kim, Paju-Si (KR); Kun A Kang, Paju-Si (KR)

(73) Assignee: Advanced Semiconductor Engineering INC., Kaohsiung (TW)

( * ) Notice: Subject to any disclaimer, the term of this patent is extended or adjusted under 35 U.S.C. 154(b) by 0 days.

(21) Appl. No.: 10/641,094

(22) Filed: Aug. 15, 2003

(51) Int. Cl.⁷ .......................... H01L 21/44; H01L 21/48; H01L 21/50
(52) U.S. Cl. .................. 438/112; 438/111; 438/113; 438/114; 438/127
(58) Field of Search ...................... 438/111–114, 118, 438/456, 458, 127, 464, 462, FOR 377

(56) References Cited

U.S. PATENT DOCUMENTS 6,281,047 B1 * 8/2001 Wu et al. .................. 438/113
6,399,415 B1 * 6/2002 Bayan et al. ............... 438/106

* cited by examiner

*Primary Examiner*—George Fourson
*Assistant Examiner*—Julio J. Maldonado

(57) ABSTRACT

A singulation method used in leadless packaging process is disclosed. An array of molded products on an upper surface of a lead frame is utilized in the singulation method. The lead frame has a plurality of dambars between the molded products. The lower surface of the lead frame is attached with a tape. Each of the molded products includes a semiconductor chip encapsulated in a package body and electrically coupled to the upper surface of the lead frame. The singulation method is accomplished by etching the upper surface of the lead frame with the package bodies as mask until each dambar is etched away.

18 Claims, 7 Drawing Sheets

SINGULATION METHOD USED IN LEADLESS PACKAGING PROCESS

BACKGROUND OF THE INVENTION

1. Field of the Invention

This invention relates to a process for making leadless semiconductor packages and more specifically to a singulation method used in the leadless packaging process.

2. Description of the Related Art

Lead frame packages have been used for a long period of time in the IC packaging history mainly because of their low manufacturing cost and high reliability. However, as integrated circuits products move its endless pace toward both a faster speed and a smaller size, the traditional lead frame packages have become gradually obsolete for some high performance-required packages. Thus BGA (Ball Grid Array Packages) and CSP (Chip Scale Package) have emerged and become increasingly popular as a new packaging choice. The former has been widely used in IC chips that have higher I/Os and need better electrical and thermal performance than the conventional packages such as CPU and graphic chips. The latter has been widely used in mobile products of which the footprint, package profile and package weight are major concerns.

However, the lead frame package still remains its market share as a cost-effective solution for low I/O ICs. Traditional lead frame package has its limit of providing a solution for chip scale and low profile package due to the long inner leads and outer leads. Therefore, the semiconductor packaging industry develops a leadless package without outer leads such that both the footprint and the package profile can be greatly reduced. FIG. 1 shows a bottom view of a leadless package 10 wherein the leads 11*a* are disposed at the bottom of the package as compared to the conventional gull-wing or J-leaded type package. The die pad 11*b* of the leadless package 10 is exposed from the bottom of the package thereby providing better heat dissipation. Typically, there are four tie bars 11*c* being connected to the die pad 11*b*. The die pad is soldered directly to a matching thermal land on an external PCB providing a low thermal-impedance path to carry heat generated from a semiconductor chip to be mounted on the die pad.

Due to the elimination of the outer leads, leadless packages are featured by lower profile and light weight. Furthermore, due to the lead length reduction, the corresponding reduction in the resistance, conductance and capacitance make the leadless package 10 very suitable for RF (radio-frequency) product packages operating in several GHz to tens of GHz frequency range. It's also a cost-effective package due to its use of existing BOM (bill of materials). All the above-mentioned properties make the current leadless packages very suitable for telecommunication products such as cellular phones, portable products such as PDA (personal digital assistant), digital cameras, and IA (Information Appliance).

The conventional leadless packaging process comprises the following steps.

Firstly, a polyimide (PI) tape was attached to the bottom of a lead frame, and this is to prevent the mold flash problem in the molding process. Typically, a lead frame (denoted as 15 in FIG. 2) for used in the aforementioned leadless packages comprises a plurality of units 11 each including a plurality of leads 11*a* arranged at the periphery of a die pad 11*b*, and a plurality of dambars 11*d* between the units 11. Each die pad 11*b* is connected to the lead frame 15 by four tie bars 11*c*.

Then, referring to FIG. 3, IC chips 12 are attached to the die pads 11*b* by means of silver epoxy, and the epoxy is cured after die attach. After that, a regular wire-bonding process is performed to make interconnections between the silicon chips 12 and the leads 11*a* of the lead frame 15. After wire bonding, each of the chips 12 attached on the lead frame 15 is encapsulated in a package body 13. Typically, an individual molding process was used to accomplish this encapsulation. The PI tape is then removed after the molding process. Finally, post-mold curing and singulation steps were conducted to complete the packaging process. In the singulation process, a resin-bond saw blade is used to cut along the dambars 11*d* thereby obtaining the finished leadless semiconductor packages. Typically, the leadless semiconductor package 10 is mounted onto a substrate, such as a printed circuit board (PC board), by using conventional surface mount technology (SMT).

One major problem during the manufacturing of the package occurred in the singulation process. Typically, the saw blade has to cut through two different materials, i.e., the metal leadframe as well as the molding compound. However, cutting through two different materials not only results in shorter blade life, but also creates lead quality problems such as metal burrs created at the lead cutting ends 14 of the leads 11*a*, which will introduce unsatisfactory coplanarity of the finished packages, thereby complicating and reducing the yield of the later SMT mounting process.

SUMMARY OF THE INVENTION

It is therefore an object of the present invention to provide a singulation method used in a leadless packaging process which overcomes, or at least reduces the above-mentioned problems of the prior art.

It is another object of the present invention to provide a singulation method used in a leadless packaging process wherein no metal burrs will be created during singulation such that the finished leadless semiconductor packages will have a better coplanarity.

To achieve the above listed and other objects, the present invention provides a singulation method comprising: (a) providing an array of molded products on an upper surface of a lead frame having a plurality of dambars between the molded products, the lower surface of the lead frame being attached with a tape, each of the molded products includes a semiconductor chip encapsulated in a package body and electrically coupled to the upper surface of the lead frame; and (b) etching the upper surface of the lead frame with the package bodies as mask until each dambar is etched away.

Since the singulation method is accomplished by etching away the dambars of the lead frame, no mechanical stress will be applied to the finished leadless semiconductor packages. Furthermore, no metal burrs will be created during the etching step; therefore, the finished leadless semiconductor packages will have a good coplanarity thereby enhancing the yield of the SMT mounting process.

According to another embodiment of the present invention, each dambar has a first portion and a second portion connecting the first portion to an adjacent molded product, and, during the etching step, the second portion of each dambar is etched away while the first portion of each dambar substantially remains intact.

The present invention further provides a process for making a plurality of leadless semiconductor packages. The process comprises the steps of: (a) providing a lead frame having opposing upper and lower surfaces, the lead frame including a plurality of units in an array arrangement and a plurality of dambars between the units, each unit having a die pad and a plurality of leads arranged at the periphery of the die pad; (b) attaching a plurality of chips onto the die pads of the lead frame; (c) electrically coupling the chips to the leads of the lead frame; (d) attaching a tape onto the lower surface of the lead frame; (e) encapsulating the chips against the upper surface of the lead frame to form a plurality of package bodies each encapsulating one of the chips; (f) etching the upper surface of the lead frame with the package bodies as mask until each dambar is etched away.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
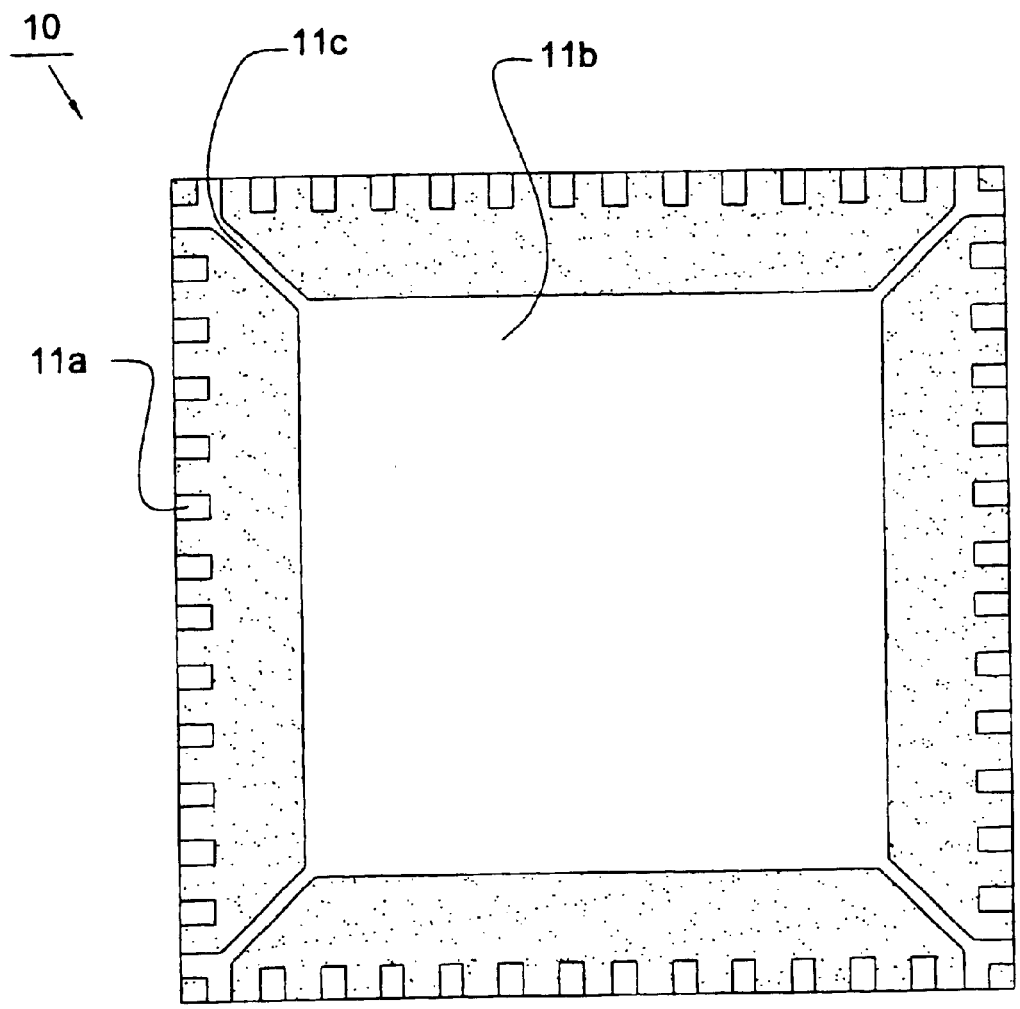
FIG. 1 is a bottom view of a conventional leadless package.
Figure 3:
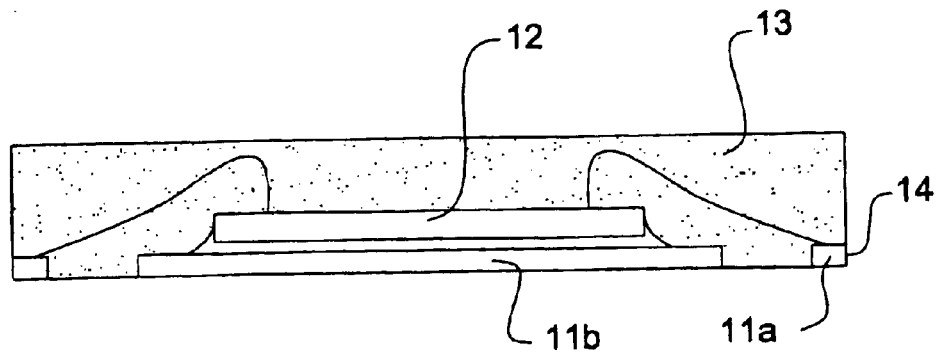
FIG. 3 is a cross sectional view of the leadless package of FIG. 1.
Figure 2:
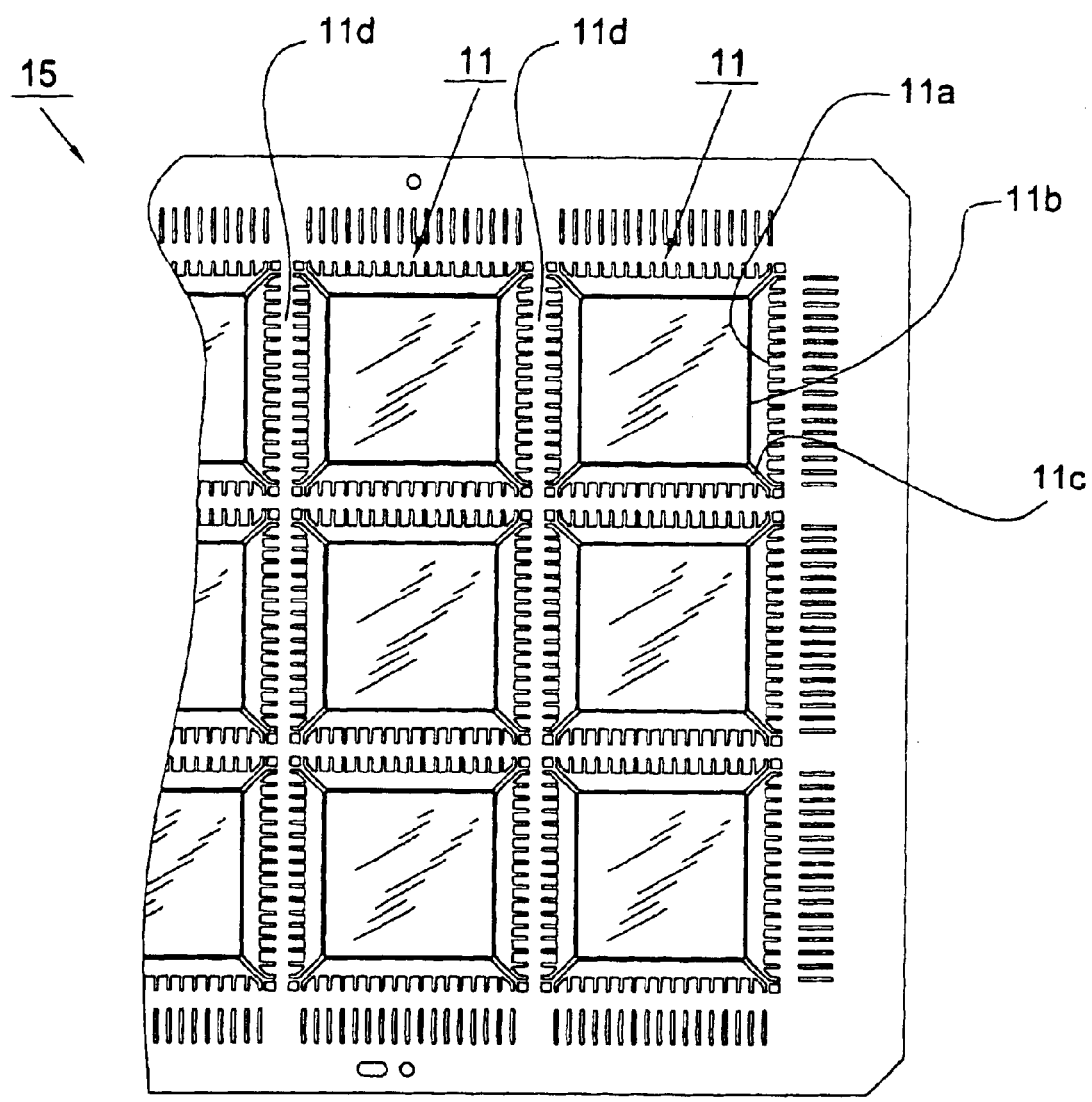
FIG. 2 is a top plan view of a conventional lead frame for use in forming leadless semiconductor packages.
Figure 4:
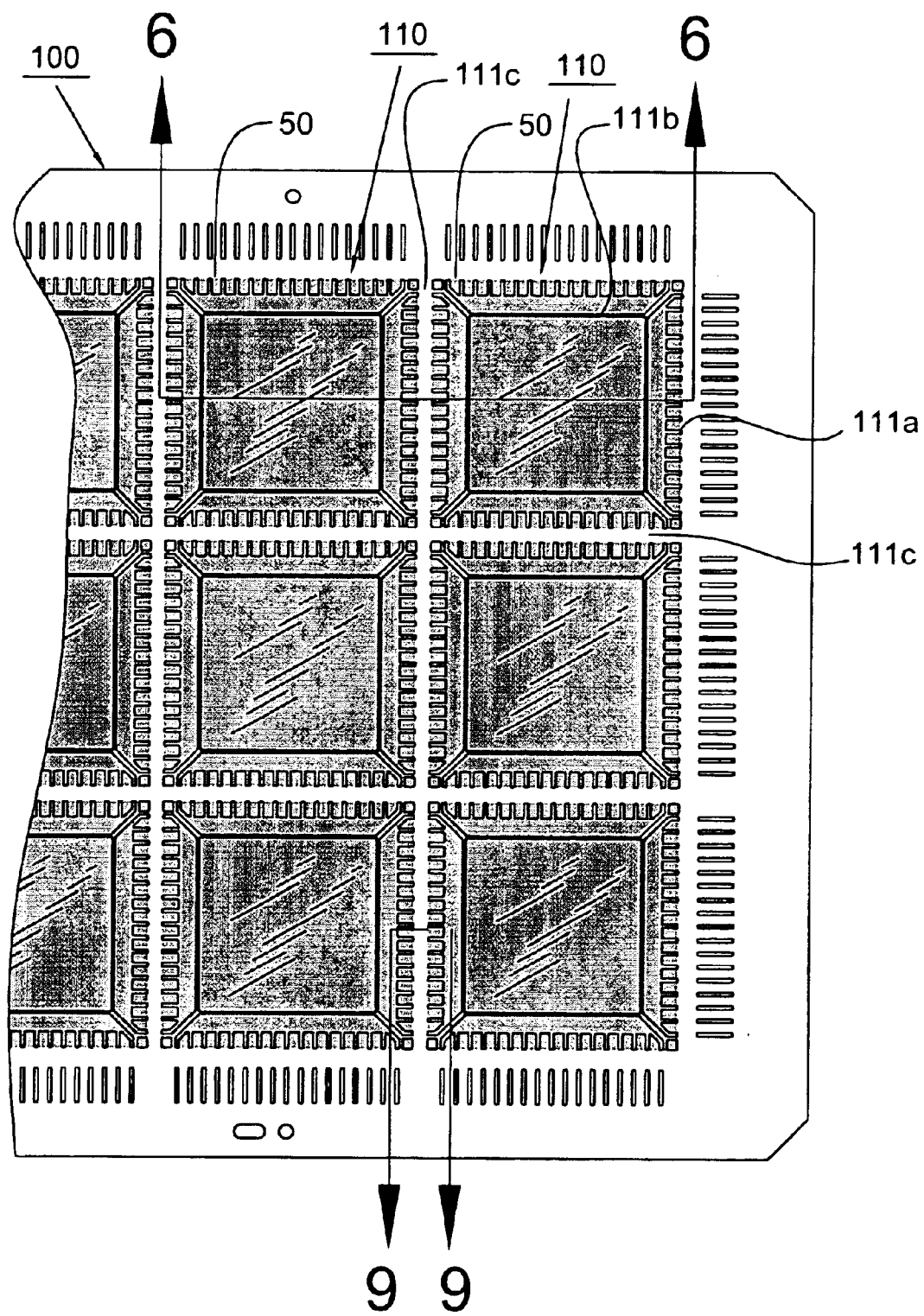
FIG. 4 is a top plan view of an array of molded products provided on a lead frame according to one embodiment of the present invention.

FIG. 4 shows an array of molded products 50 which are hatched in FIG. 4 to facilitate understanding. The molded products 50 are provided on a lead frame 100. The lead frame 100 has an upper surface and a lower surface opposed to the upper surface. The lead frame 100 comprises a plurality of units 110 each including a plurality of leads 111a arranged at the periphery of a die pad 111b. The units 110 of the lead frame 100 are separated from each other by a plurality of dambars 111c. The dambars 111c generally form an orthogonal grid on the lead frame 100. Specifically, the dambars 111c are defined between the leads 111a at the periphery of the die pads 111b. The lead frame 100 is typically made of a copper-base alloy or made of copper or alloys containing copper, and shaped by pressing or etching. Lead frames suitable for use in the present invention are available in three lead finishes: post plated SnPb and Matte Sn, and pre plated Ni/Pd with flash of Au (i.e., PPF (Pre-Plating Lead Frame)).

FIG. 5 to FIG. 8 illustrate a process for making a plurality of leadless semiconductor packages according to one embodiment of the present invention.

Figure 5:
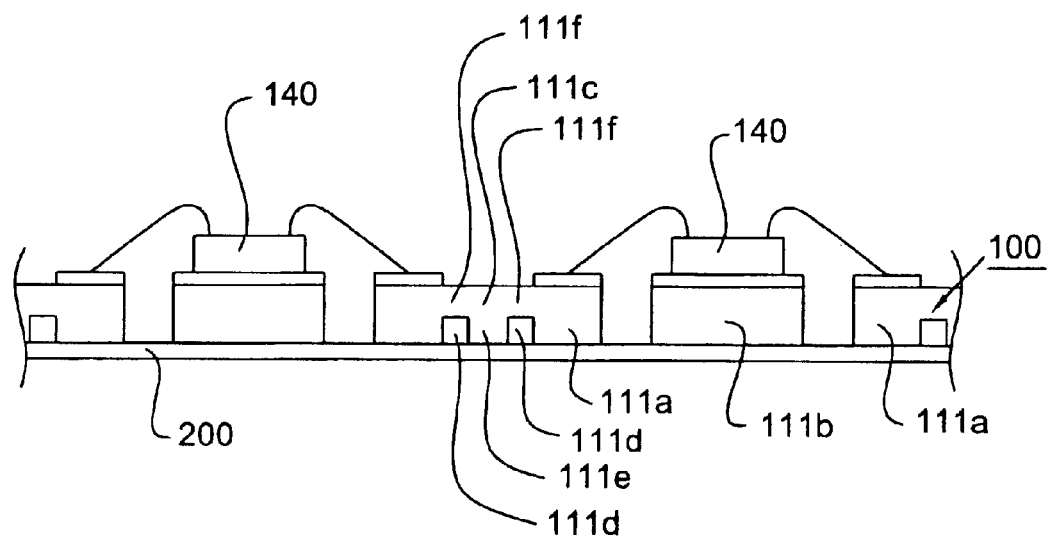
FIG. 5 to FIG. 8 illustrate a process for making a plurality of leadless semiconductor packages according to one embodiment of the present invention.

Referring to FIG. 5, a polyimide (PI) tape 200 is attached onto the lower surface of the lead frame 100, and this is to prevent the mold flash problem in the molding process. Then, semiconductor chips 140 are respectively attached to the die pads 111b by means of silver epoxy (not shown), and the epoxy is cured after die attach. After that, a regular wire-bonding process is performed to make interconnections between the semiconductor chips 140 and the leads 111a of the lead frame 100.

Figure 6:
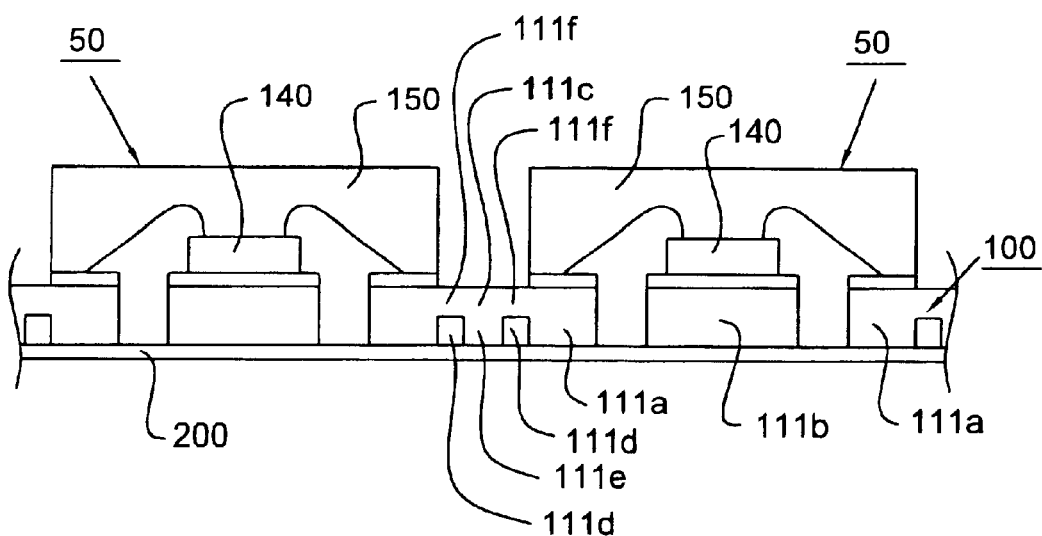

Referring to FIG. 6, the chips 140 are encapsulated against the upper surface of the lead frame 100 to form the aforementioned molded products 50. After encapsulating, each of the chips 140 is encapsulated in a package body 150. In this embodiment, each dambar 111c of the lead frame 100 has two grooves 111d in the lower surface of the lead frame and adjacent to the leads 111a. Each dambar 111c has a first portion 111e and a second portion 111f connecting the first portion 111e to an adjacent molded product 50.

Figure 7:
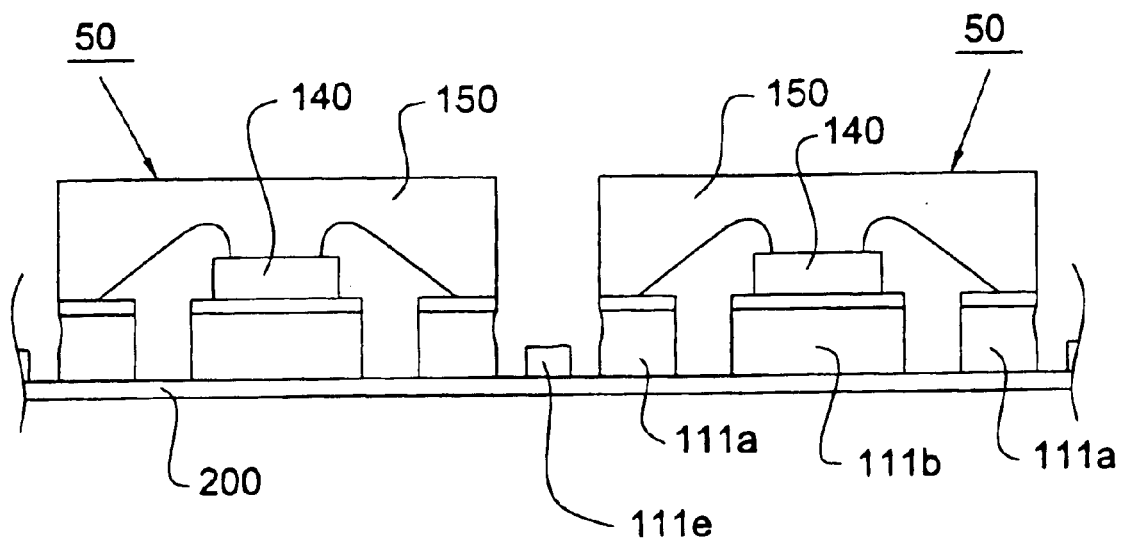

Thereafter, a singulation step is conducted to separate the assembly shown in FIG. 6 into individual leadless semiconductor packages on the PI tape 200. Referring to FIG. 7, the singulation step is accomplished by removing the second portions 111f of the dambars 111c via an etching process. Specifically, the etching process is conducted by etching the upper surface of the lead frame 100 with the package bodies 150 as mask. It is noted that, after the etching operation, the first portions 111e of the dambars 111c remain intact. Since the singulation step is accomplished by etching away the first portion 111f of the dambars 111c of the lead frame, no mechanical stress will be applied to the finished leadless semiconductor packages. Furthermore, no metal burrs will be created during the etching step; therefore, the finished leadless semiconductor packages will have a good coplanarity thereby enhancing the yield of the SMT mounting process.

Figure 8:
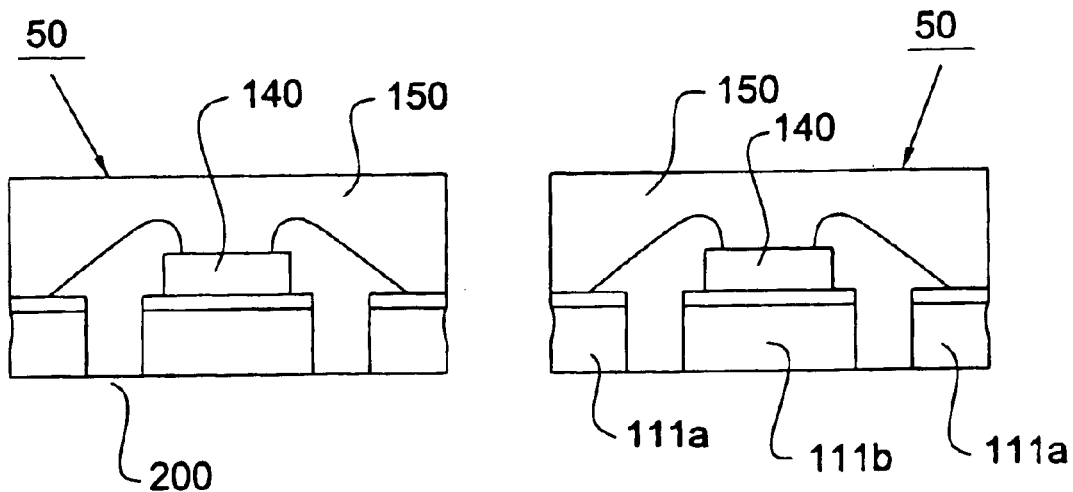

Referring to FIG. 8, the PI tape 200 is removed after the singulation step. The finished leadless semiconductor package can be mounted onto a substrate, such as a printed circuit board (PC board), like other leadless devices. For example, a PC board is screen printed with a solder paste in a pattern that corresponds to the pattern of the leads exposed from the bottom of the package. The package is then appropriately positioned on the PC board and the solder is reflowed by using the conventional surface mount technology. Alternatively, the leads exposed from the bottom of the package can be printed with solder paste and then mounted onto the PC board. Preferably, a tin/lead-plating step is performed before soldering the package to PCB thereby enhancing solderability. Specifically, a layer of tin/lead is plated on the leads exposed from the bottom of the package.

Figure 9:
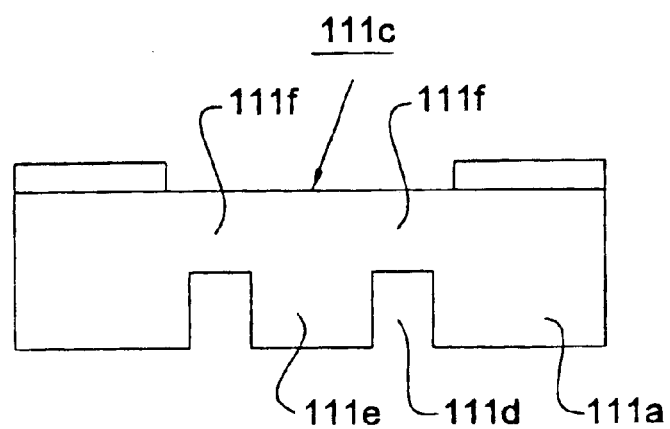
FIG. 9 is a cross-sectional view taken along line 9—9 of FIG. 4 which illustrates the dambar design according to one embodiment of the present invention.
Figure 10:
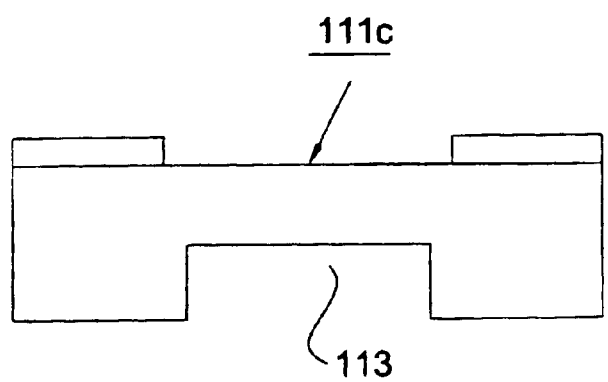
FIG. 10 is a cross-sectional view illustrating another dambar design according to another embodiment of the present invention.
Figure 11:
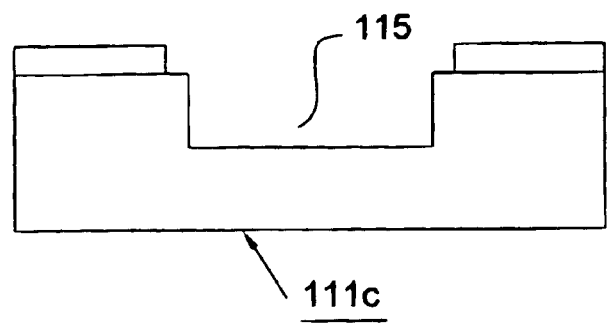
FIG. 11 is a cross-sectional view illustrating another dambar design according to another embodiment of the present invention.
Figure 12:
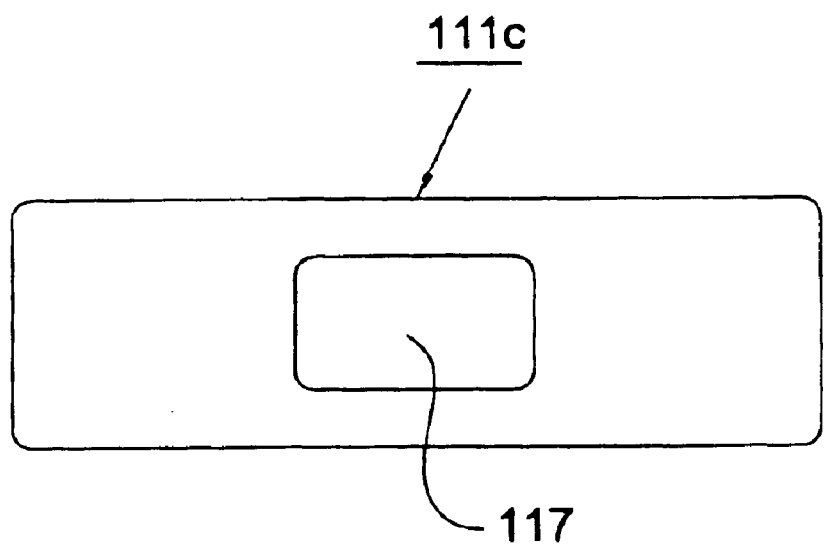
FIG. 12 is a top plan view illustrating another dambar design according to another embodiment of the present invention.
Figure 13:
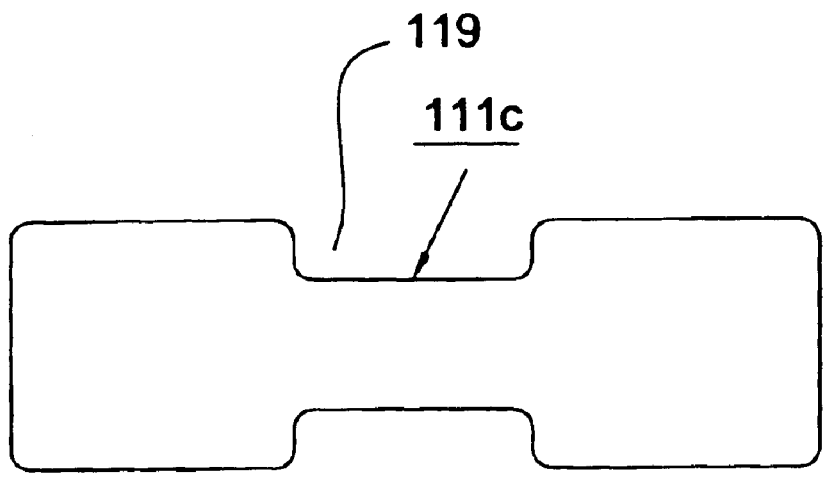
FIG. 13 is a cross-sectional view illustrating another dambar design according to another embodiment of the present invention.

Although the present invention is discussed in detail with respect to a lead frame having two grooves as best shown in FIG. 9 formed in each dambar thereof, the present invention is applicable to a wide variety of dambar designs as illustrated below. For example, each of the dambars may have only one groove such that each of the dambars has a thickness smaller that the thickness of another portion of the lead frame. As shown in FIG. 10, the dambar 111c may have a groove 113 formed in the lower surface of the lead frame. As shown in FIG. 11, the dambar 111c may have a groove 115 formed in the upper surface of the lead frame. As shown in FIG. 12, the dambar 111c may have a through hole 117 formed therein. As shown in FIG. 13, the dambar 111c may have a groove 119 formed in the side surfaces of the dambars. The grooves or through holes formed in the dambars of the lead frame can help to reduce the "undercut" problem occurred in the isotropic etching process conducted in the singulation step. If lead frames based on the dambar designs shown in FIGS. 10–13 are used in the present invention, the dambar should be completely etched away during the singulation step.

The aforementioned grooves and through holes may be formed by half-etching each of the dambars of the lead frame. Specifically, "half-etching" may comprise the steps of: (a) forming a photoresist layer on the lead frame by conventional techniques such as dry film lamination; (b) photodefining the photoresist layer through a photomask and developing such that areas on the surface of the lead frame at which they are desired to form the grooves or through holes are not covered by the photoresist; (c) etching areas on the lower surfaces of the lead frame exposed from the remaining photoresist layer to form the grooves or the through holes; and (d) stripping the remaining photoresist by using conventional techniques. It is noted that the "half-etching" herein does not mean only exactly removing half of the thickness of the lead frame through etching but also includes a partial etching for removing merely a part of the thickness of the lead frame.

It is noted that the singulation step of the present invention is accomplished by etching away the dambars of the lead frame. Therefore, no mechanical stress will be applied to the finished leadless semiconductor packages thereby obtaining a better package integrity. Furthermore, clamping related issue on the dambar region can be solved by skipping the conventional cutting step from the packaging process of the present invention.

Although the invention has been explained in relation to its preferred embodiment, it is to be understood that many other possible modifications and variations can be made without departing from the spirit and scope of the invention as hereinafter claimed.

What is claimed is:

1. A singulation method used in a process for making a plurality of leadless semiconductor packages, the singulation method comprising the following steps:

providing an array of molded products on an upper surface of a lead frame having a plurality of dambars between the molded products, the lower surface of the lead frame being attached with a tape, each of the molded products includes a semiconductor chip encapsulated in a package body and electrically coupled to the upper surface of the lead frame, each dambar having two grooves in the lower surface of the lead frame and adjacent to the molded product wherein each dambar has a first portion and a second portion connecting the first portion to an adjacent molded product; and etching the upper surface of the lead frame with the package bodies as mask until the second portion of each dambar is etched away while the first portion of each dambar substantially remains intact.

2. The method as claimed in claim 1, wherein the groove is formed by half-etching the dambar of the lead frame at a location adjacent to the molded product.

3. A singulation method used in a process for making a plurality of leadless semiconductor packages, the singulation method comprising the following steps:

providing an array of molded products on an upper surface of a lead frame having a plurality of dambars between the molded products, the lower surface of the lead frame being attached with a tape, each of the molded products includes a semiconductor chip encapsulated in a package body and electrically coupled to the upper surface of the lead frame; and etching the upper surface of the lead frame with the package bodies as mask until each dambar is etched away.

4. The method as claimed in claim 3, wherein each of the dambars has at least one groove formed therein.

5. The method as claimed in claim 4, wherein each groove is formed by half-etching each of the dambars of the lead frame.

6. The method as claimed in claim 4, wherein the grooves of the dambars are formed in the upper surface or the lower surface of the lead frame.

7. The method as claimed in claim 4, wherein the grooves of the dambars are formed in the side surfaces of the dambars.

8. The method as claimed in claim 3, wherein each of the dambars has a thickness smaller that the thickness of another portion of the lead frame.

9. The method as claimed in claim 3, wherein each of the dambars has at least one through hole formed therein.

10. A process for making a plurality of leadless semiconductor packages, comprising the following steps:

providing a lead frame having opposing upper and lower surfaces, the lead frame including a plurality of units in an array arrangement and a plurality of dambars between the units, each unit having a die pad and a plurality of leads arranged at the periphery of the die pad, each dambar having two grooves in the lower surface of the lead frame and adjacent to the leads wherein each dambar has a first portion and a second portion connecting the first portion to an adjacent molded product;

attaching a plurality of chips onto the die pads of the lead frame;

electrically coupling the chips to the leads of the lead frame;

attaching a tape onto the lower surface of the lead frame;

encapsulating the chips against the upper surface of the lead frame to form a plurality of package bodies each encapsulating one of the chips;

etching the upper surface of the lead frame with the package bodies as mask until the second portion of each dambar is etched away while the first portion of each dambar substantially remains intact;

removing the tape with the first portion of each dambar to obtain the leadless semiconductor packages.

11. The process as claimed in claim 10, wherein the groove is formed by half-etching the dambar of the lead frame at a location adjacent to the molded product.

12. A process for making a plurality of leadless semiconductor packages, comprising the following steps:

providing a lead frame having opposing upper and lower surfaces, the lead frame including a plurality of units in an array arrangement and a plurality of dambars between the units, each unit having a die pad and a plurality of leads arranged at the periphery of the die pad;

attaching a plurality of chips onto the die pads of the lead frame;

electrically coupling the chips to the leads of the lead frame;

attaching a tape onto the lower surface of the lead frame;

encapsulating the chips against the upper surface of the lead frame to form a plurality of package bodies each encapsulating one of the chips;

etching the upper surface of the lead frame with the package bodies as mask until each dambar is etched away;

removing the tape to obtain the leadless semiconductor packages.

13. The process as claimed in claim 12, wherein each of the dambars has at least one groove formed therein.

14. The process as claimed in claim 13, wherein each groove is formed by half-etching each of the dambars of the lead frame.

15. The process as claimed in claim 13, wherein the grooves of the dambars are formed in the upper surface or the lower surface of the lead frame.

16. The process as claimed in claim 13, wherein the grooves of the dambars are formed in the side surfaces of the dambars.

17. The process as claimed in claim 12, wherein each of the dambars has a thickness smaller that the thickness of another portion of the lead frame.

18. The process as claimed in claim 12, wherein each of the dambars has at least one through hole formed therein.

* * * * *